US012755943B2

(12) United States Patent
Huderi Somanna et al.

(10) Patent No.: US 12,755,943 B2
(45) Date of Patent: Oct. 6, 2026

(54) EXTERNAL COOLING ASSEMBLY FOR SUBSTRATE SUPPORT

(71) Applicant: Applied Materials, Inc., Santa Clara, CA (US)

(72) Inventors: Dinkesh Huderi Somanna, San Jose, CA (US); Dan Deyo, Austin, TX (US)

(73) Assignee: Applied Materials Inc., Santa Clara, CA (US)

( * ) Notice: Subject to any disclaimer, the term of this patent is extended or adjusted under 35 U.S.C. 154(b) by 10 days.

(21) Appl. No.: 18/608,714

(22) Filed: Mar. 18, 2024

(65) Prior Publication Data

US 2025/0293008 A1 Sep. 18, 2025

(51) Int. Cl.

| | |
|---|---|
| ***H01J 37/32*** | (2006.01) |
| ***C23C 14/34*** | (2006.01) |
| ***C23C 14/50*** | (2006.01) |
| ***C23C 14/54*** | (2006.01) |
| ***H01J 37/34*** | (2006.01) |
| ***H10P 72/72*** | (2026.01) |

(52) U.S. Cl.

CPC ........ *H01J 37/32724* (2013.01); *C23C 14/34* (2013.01); *C23C 14/50* (2013.01); *C23C 14/541* (2013.01); *H01J 37/3244* (2013.01); *H01J 37/32715* (2013.01); *H01J 37/3411* (2013.01); *H10P 72/72* (2026.01); *H01J 2237/002* (2013.01); *H01J 2237/2007* (2013.01); *H10P 72/722* (2026.01)

(58) Field of Classification Search

CPC .... C23C 14/34; C23C 14/50; H01J 37/32715; H01J 37/3411; H01J 37/3244; H01L 21/6833

See application file for complete search history.

(56) References Cited

U.S. PATENT DOCUMENTS

| | | | | |
|---|---|---|---|---|
| 6,689,221 | B2 * | 2/2004 | Ryding | C23C 14/505 118/724 |
| 6,731,496 | B2 * | 5/2004 | Hiramatsu | H10P 72/0434 219/544 |
| 7,601,224 | B2 * | 10/2009 | Foree | C23C 16/4584 118/724 |
| 9,034,771 | B1 | 5/2015 | Nangoy | |
| 9,668,373 | B2 | 5/2017 | West et al. | |
| 2008/0276864 | A1 | 11/2008 | Koelmel et al. | |
| 2011/0089166 | A1 | 4/2011 | Hunter et al. | |

(Continued)

OTHER PUBLICATIONS

International Search Report for PCT/US2025/020204, dated Jul. 3, 2025.

*Primary Examiner* — Michael A Band
(74) *Attorney, Agent, or Firm* — Moser Taboada

(57) ABSTRACT

Embodiments of cooling assemblies for substrate supports are provided herein. In some embodiments, a cooling assembly for a substrate support includes a pedestal having a substrate supporting surface and a backside opposite the substrate supporting surface; and a cooling assembly coupled to the pedestal and configured to provide cooling gas to the backside of the pedestal, wherein the cooling assembly includes: a cooling member having a cooling channel disposed therein; an inlet extending from the cooling channel to an outer surface of the cooling member; and a one or more outlets extending from the cooling channel to an upper surface of the cooling member.

12 Claims, 8 Drawing Sheets

(56) References Cited

U.S. PATENT DOCUMENTS

| | | | |
|---|---|---|---|
| 2015/0354054 | A1 | 12/2015 | Fruchterman et al. |
| 2021/0066050 | A1 | 3/2021 | Babu et al. |
| 2023/0212735 | A1 | 7/2023 | Nanjundappa et al. |

* cited by examiner

EXTERNAL COOLING ASSEMBLY FOR SUBSTRATE SUPPORT

FIELD

Embodiments of the present disclosure generally relate to substrate processing equipment.

BACKGROUND

Substrate supports are typically disposed in process chambers for supporting substrates during processing such as deposition processes, etch processes, thermal processes, cleaning processes, or the like. Certain substrate supports may comprise an electrostatic chuck for electrostatic chucking of a substrate. Conventional substrate supports may cool a central region of the electrostatic chuck. However, for higher temperature applications (>300 Celsius), a peripheral region of the electrostatic chuck may become too hot as compared to the central region, leading to higher stress in the electrostatic chuck and non-uniform deposition or etching of the substrate.

Accordingly, the inventors have provided herein embodiments of improved substrate supports.

SUMMARY

Embodiments of cooling assemblies for substrate supports are provided herein. In some embodiments, a cooling assembly for a substrate support includes a pedestal having a substrate supporting surface and a backside opposite the substrate supporting surface; and a cooling assembly coupled to the pedestal and configured to provide cooling gas to the backside of the pedestal, wherein the cooling assembly includes: a cooling member having a cooling channel disposed therein; an inlet extending from the cooling channel to an outer surface of the cooling member; and a one or more outlets extending from the cooling channel to an upper surface of the cooling member.

In some embodiments, a substrate support includes: a pedestal having a substrate supporting surface and a backside opposite the substrate supporting surface; and a cooling assembly coupled to the pedestal and configured to provide cooling gas to the backside of the pedestal, wherein the cooling assembly includes: a first hub component, comprising a first cooling member that is arcuate in shape and having a first cooling channel disposed therein that is fluidly coupled to a first inlet that extends to an outer surface of the first cooling member, and one or more first outlets extending from the first cooling channel to an upper surface of the first cooling member; and a second hub component, comprising a second cooling member that is arcuate in shape and having a second cooling channel disposed therein that is fluidly coupled to a second inlet that extends to an outer surface of the second cooling member; and one or more second outlets extending from the second cooling channel to an upper surface of the second cooling member; and wherein when the second hub component is placed adjacent the first hub component, the first cooling member is vertically aligned with the second cooling member to together form an annular cooling assembly, wherein the one or more first outlets and the one or more second outlets are disposed along a circular array.

In some embodiments, a process chamber includes: a chamber body defining an interior volume therein; a pedestal disposed in the interior volume and comprising: an electrostatic chuck (ESC) having a substrate supporting surface and a backside opposite the substrate supporting surface; and a base assembly coupled to a lower surface of the ESC; and a cooling assembly disposed about the base assembly and configured to provide cooling gas to the backside of the ESC, wherein the cooling assembly includes: a cooling member having a cooling channel disposed therein; an inlet extending from the cooling channel to an outer surface of the cooling member; one or more outlets extending from the cooling channel to an upper surface of the cooling member; and a bracket coupled to the cooling member, wherein the bracket includes an arm extending beneath the cooling member and an arcuate lower plate coupled to the arm and disposed radially inward from the cooling member, wherein the arcuate lower plate is coupled to the base assembly via a fastener opening disposed in the arcuate lower plate.

Other and further embodiments of the present disclosure are described below.

BRIEF DESCRIPTION OF THE DRAWINGS

Embodiments of the present disclosure, briefly summarized above and discussed in greater detail below, can be understood by reference to the illustrative embodiments of the disclosure depicted in the appended drawings. However, the appended drawings illustrate only typical embodiments of the disclosure and are therefore not to be considered limiting of scope, for the disclosure may admit to other equally effective embodiments.

Figure 1:
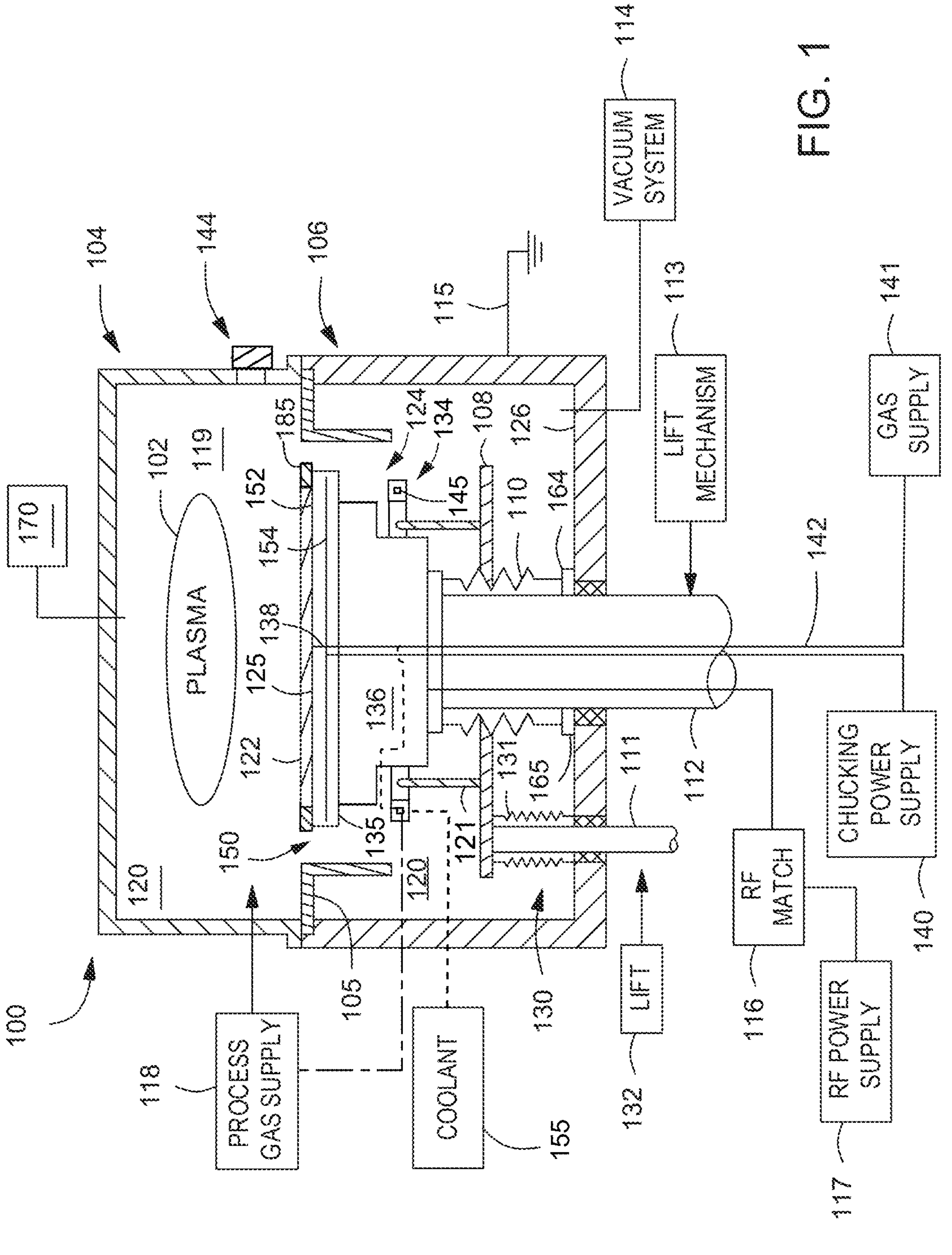
FIG. 1 depicts a schematic side view of a process chamber in accordance with at least some embodiments of the present disclosure.

To facilitate understanding, identical reference numerals have been used, where possible, to designate identical elements that are common to the figures. The figures are not drawn to scale and may be simplified for clarity. Elements and features of one embodiment may be beneficially incorporated in other embodiments without further recitation.

DETAILED DESCRIPTION

Embodiments of cooling assemblies for substrate supports are provided herein. The cooling assemblies are external to and spaced from a backside of a pedestal of the substrate support, for example, a backside of an electrostatic chuck of the pedestal. The cooling assembly is configured to direct a cooling fluid towards the backside of the pedestal to cool a peripheral region of the pedestal. Cooling of the peripheral region of the pedestal advantageously reduces stress on the pedestal and promote more uniform deposition on the substrate or etching of the substrate. The cooling assembly also advantageously reduces the temperature of process kit components that contact or are proximate to the pedestal, for example, deposition rings, cover rings, and the like.

FIG. 1 depicts a schematic side view of a process chamber 100 in accordance with at least some embodiments of the present disclosure. In some embodiments, the process chamber is a physical vapor deposition (PVD) chamber. However, other types of process chambers configured for different processes can also be used or be modified for use with embodiments of the substrate supports described herein.

The process chamber 100 may generally be a vacuum chamber which is suitably adapted to maintain sub-atmospheric pressures within an interior volume 120 of the process chamber during substrate processing. The process chamber 100 includes a chamber body 106 covered by a lid 104 which encloses a processing volume 119 located in the upper half of interior volume 120. The process chamber 100 may also include one or more shields 105 circumscribing various chamber components to prevent unwanted reaction between such components and ionized process material. The chamber body 106 and lid 104 may be made of metal, such as aluminum. The chamber body 106 may be grounded via a coupling to ground 115.

A substrate support 124 is disposed within the interior volume 120 to support and retain a substrate 122, such as a semiconductor wafer, for example, or other such substrate as may be electrostatically retained. The substrate support 124 may generally comprise a pedestal 150 and a support shaft 112 coupled to the pedestal 150. The pedestal 150 includes a substrate supporting surface 125 and a backside 135 opposite the substrate supporting surface 125. The pedestal 150 may comprise an electrostatic chuck 152 disposed on a base assembly 136. The base assembly 136 may be coupled to a lower surface of the electrostatic chuck 152. In some embodiments, the backside 135 is a peripheral backside surface of the electrostatic chuck 152. In some embodiments, the substrate support 124 includes a deposition ring 185 disposed on the electrostatic chuck 152 about the substrate 122 configured to protect the electrostatic chuck 152 and sidewalls of the chamber body 106 from unwanted deposition. The electrostatic chuck 152 includes one or more chucking electrodes 154 disposed therein that are configured to electrostatically chuck the substrate 122 to the electrostatic chuck 152. The one or more chucking electrodes 154 may also electrostatically chuck the deposition ring 185 to the electrostatic chuck 152.

The support shaft 112 may act as a conduit to provide, for example, backside gases, process gases, fluids, coolants, power, or the like, to the pedestal 150. In some embodiments, the support shaft 112 is coupled to a lift mechanism 113, such as an actuator or motor, which provides vertical movement of the pedestal 150 between an upper, processing position (as shown in FIG. 1) and a lower, transfer position (not shown). A bellows assembly 110 is disposed about the support shaft 112 and is coupled between the pedestal 150 and a bottom surface 126 of process chamber 100 to provide a flexible seal that allows vertical motion of the pedestal 150 while preventing loss of vacuum from within the process chamber 100. The bellows assembly 110 also includes a lower bellows flange 164 in contact with an o-ring 165 or other suitable sealing element which contacts the bottom surface 126 to help prevent loss of chamber vacuum.

In some embodiments, the support shaft 112 facilitates coupling a backside gas supply 141, a chucking power supply 140, and RF sources (e.g., RF plasma power supply 170 and a bias power supply 117) to the pedestal 150. In some embodiments, the bias power supply 117 includes one or more RF bias power sources. In some embodiments, RF energy supplied by the RF plasma power supply 170 may have a frequency of about 400 kHz to over 40 MHz. The backside gas supply 141 is disposed outside of the chamber body 106 and supplies heat transfer gas to the pedestal 150. In some embodiments, a RF plasma power supply 170 and a bias power supply 117 are coupled to the pedestal 150 via respective RF match networks (only RF match network 116 shown). In some embodiments, the substrate support 124 may alternatively include AC, DC, or RF bias power. In some embodiments, the AC, DC, or RF bias power may be pulsed.

The process chamber 100 may include a second lift 130. The second lift 130 can include lift pins 121 mounted on a platform 108 connected to a shaft 111 which is coupled to a second lift mechanism 132 for raising and lowering the substrate 122 onto or off of the pedestal 150. In some embodiments, the second lift 130 may comprise a plurality of lift mechanisms for independently controlling the lift pins 121. The pedestal 150 may include through holes to receive the lift pins 121. A bellows assembly 131 is coupled between the second lift 130 and bottom surface 126 to provide a flexible seal which maintains the chamber vacuum during vertical motion of the second lift 130. In some embodiments, as shown in FIG. 1, the second lift 130 is disposed outside of the support shaft 112.

In some embodiments, the pedestal 150 includes gas distribution channels 138 extending from a lower surface of the pedestal 150 (e.g., bottom surface of the base assembly 136) to one or more openings in an upper surface of the pedestal 150. The gas distribution channels 138 are configured to provide backside gas, such as nitrogen (N), argon (Ar), or helium (He), to the top surface of the pedestal 150 to act as a heat transfer medium. The gas distribution channels 138 are in fluid communication with the backside gas supply 141 via gas conduit 142 to control the temperature and/or temperature profile of the pedestal 150 during use.

The process chamber 100 is coupled to and in fluid communication with a vacuum system 114 which includes a throttle valve (not shown) and vacuum pump (not shown) which are used to exhaust the process chamber 100. The pressure inside the process chamber 100 may be regulated by adjusting the throttle valve and/or vacuum pump. The process chamber 100 is also coupled to and in fluid communication with a process gas supply 118 which may supply one or more process gases such as nitrogen (N), argon (Ar), or helium (He), to the process chamber 100 for processing a substrate disposed therein. The process chamber 100 includes a slit valve 144 to facilitate transferring the substrate 122 into and out of the interior volume 120. In some embodiments, a transfer robot (not shown) is configured to transfer the substrate 122. The slit valve 144 may be coupled to the lid 104 or chamber body 106.

A target 190 is disposed in the interior volume 120 opposite the substrate support 124 and proximate the lid 104. In some embodiments, the target 190 is coupled to the lid 104. The target 190 generally comprises a source material to be deposited on the surface of the substrate 122 during sputtering. The source material may be a suitable metal, metal oxide, or metal alloy.

In operation, for example, the RF plasma power supply 170 may energize process gas from, for example, the process gas supply 118 to form a plasma 102 in the processing volume 119. The plasma 102 impinges upon and bombards a sputtering surface of the target 190 to sputter material off of the target 190 onto the substrate 122. A bias power may be provided from a bias power supply (e.g., bias power supply 117) to the pedestal 150 to attract sputter material towards the substrate 122. The bias power supply 117 may supply bias power to the electrostatic chuck 152.

A cooling assembly 134 is disposed about and coupled to the base assembly 136. The cooling assembly 134 generally includes a cooling member having a cooling channel 145 disposed therein (discussed in more detail below). The cooling member may have any suitable shape, such as annular, star shaped, octagon shaped, arcuate, double semi-circular shaped, or the like. In some embodiments, a cooling fluid source is coupled to the cooling channel 145. In some embodiments, the cooling fluid source is the backside gas supply 141 provided via the substrate support 124. In some embodiments, the cooling fluid source is the process gas supply 118 provided via sidewalls of the chamber body 106. In some embodiments, the cooling fluid source is a coolant source 155 comprising a liquid coolant, such as water.

Figure 2:
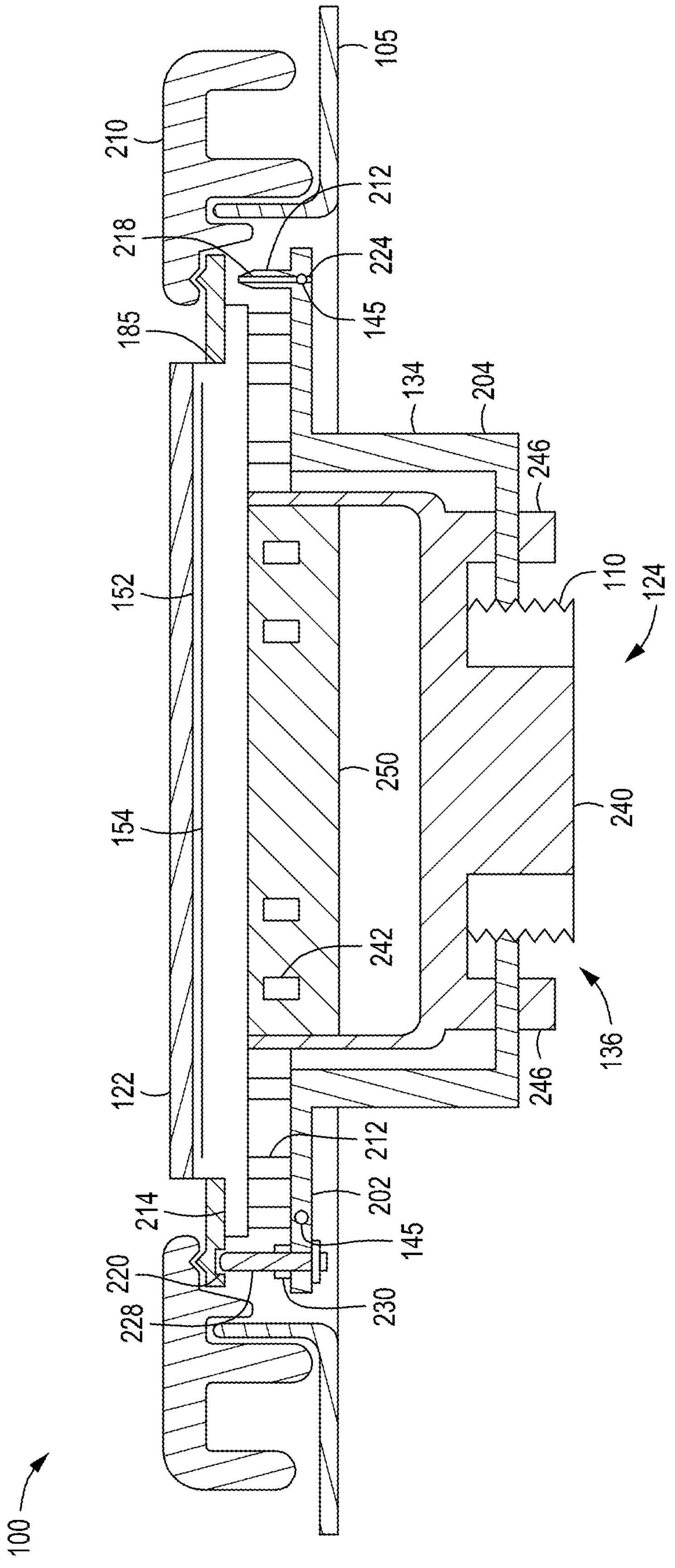
FIG. 2 depicts a cross-sectional side view of a process chamber in accordance with at least some embodiments of the present disclosure.

FIG. 2 depicts a cross-sectional side view of a portion of a process chamber 100 in accordance with at least some embodiments of the present disclosure. The cooling assembly 134 includes a cooling member 202 having the cooling channel 145 disposed therein. In some embodiments, the cooling member 202 has an upper surface 206 that is planar. An inlet 224 extends from the cooling channel 145 to an outer surface of the cooling member 202, such as a lower surface of side surface of the cooling member 202. In some embodiments, the inlet 224 is disposed beneath the cooling channel 145 and extends to a lower surface of the cooling member 202. The inlet 224 is coupled to the cooling fluid source. One or more outlets 218 extend from the cooling channel 145 to the upper surface 206 of the cooling member 202. In some embodiments, the one or more outlets 218 may be a single outlet comprising a continuous slot or a plurality of holes. The one or more outlets 218 are configured to direct a cooling fluid towards a peripheral region of the electrostatic chuck 152.

In some embodiments, a plurality of posts 212 extend from the upper surface 206 of the cooling member 202. In some embodiments, the plurality of outlets 218 extend from the cooling channel 145 to the upper surface 206 and through the plurality of posts 212. In some embodiments, the plurality of posts 212 are disposed radially outward of an outer sidewall of the electrostatic chuck 152. In some embodiments, the plurality of posts 212 are disposed in a circular array.

A deposition ring 185 is disposed on a peripheral edge of the electrostatic chuck 152. In some embodiment, the deposition ring 185 includes a groove 220 on a lower surface 214 thereof. A pin 228 is coupled to the cooling member 202. In some embodiments, the pin 228 is coupled to the cooling member 202 via a nut 230. In some embodiments, the pin 228 is disposed radially outward of the cooling channel 145. In some embodiments, the 228 pin extends into the groove 220 of the deposition ring 185 to prevent rotation of the deposition ring 185 with respect to the cooling assembly 134. In some embodiments, the cooling fluid from the one or more outlets 218 is configured to cool the deposition ring 185.

A cover ring 210 may be disposed about the deposition ring 184 to further protect chamber components such as inner surfaces of the chamber body 106 from unwanted deposition. In some embodiments, the cover ring 210 may rest on the one or more shields 105 when the substrate support 124 is in a lowered position. The cover ring 210 may rest on the deposition ring 185 when the substrate support 124 is in an upper, processing position. In the processing position, the cover ring 210 is spaced from the one or more shields 105 to provide a tortuous flow path therebetween. In some embodiments, the cooling fluid from the one or more outlets 218 is configured to cool the cover ring 210. In some embodiments, the cooling fluid is Argon gas.

In some embodiments, the base assembly 136 includes a base plate 240 and a cooling plate 250 coupled to the base plate 240. The cooling plate 250 contacts a lower surface of the electrostatic chuck 152 and is configured to cool a central region of the electrostatic chuck 152 via cooling channels 242 disposed in the cooling plate 250. The cooling assembly 134 is disposed about the base assembly 136. In some embodiments, the cooling assembly 134 includes a bracket 204 coupled to the cooling member 202. In some embodiments, the bracket 204 extends downward from a lower surface of the cooling member 202. In some embodiments, the bracket 204 is coupled to the base plate 240 via one or more fasteners 246. In some embodiments, the one or more fasteners 245 consists of exactly two fasteners.

Figure 3:
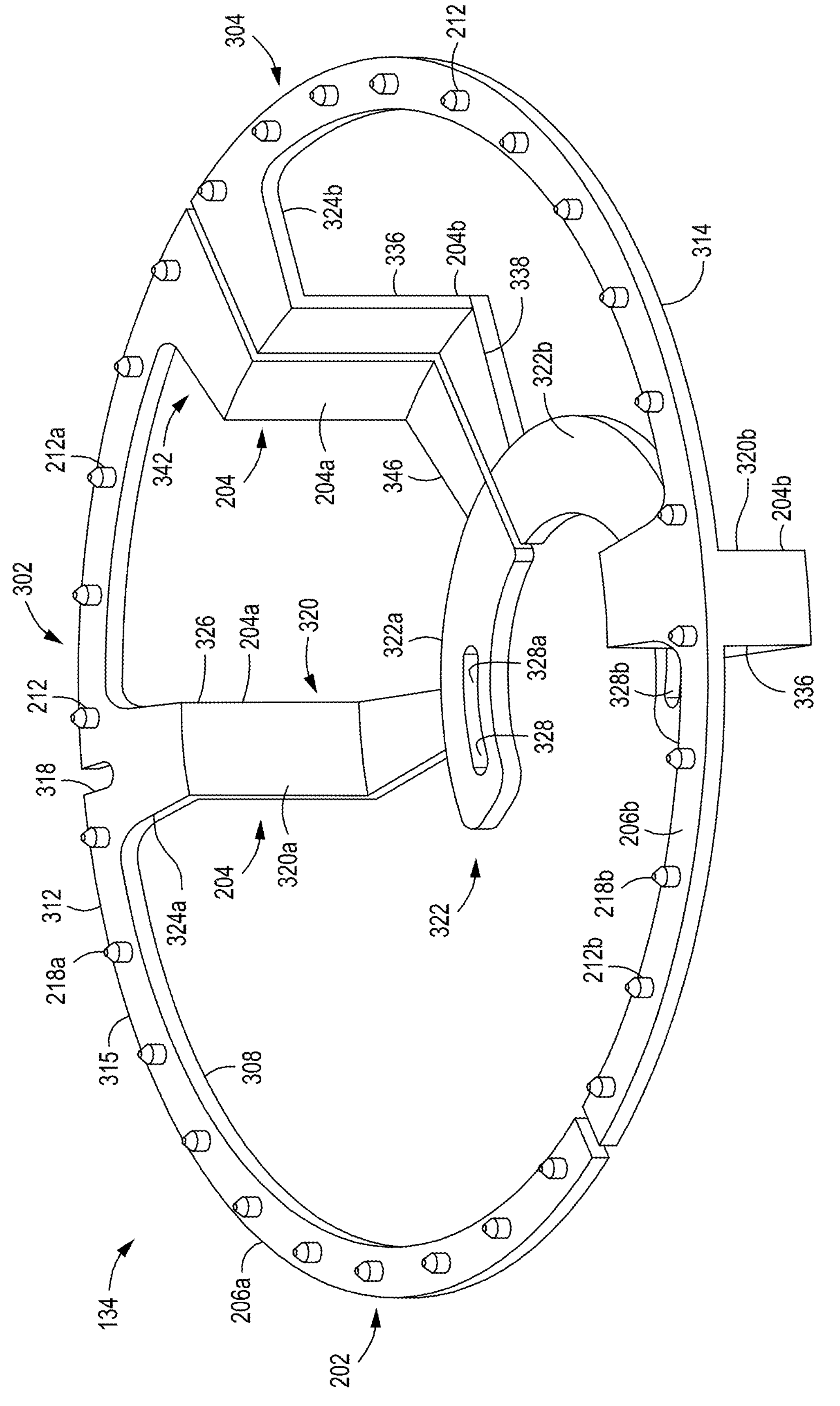
FIG. 3 depicts an isometric view of a cooling assembly in accordance with at least some embodiments of the present disclosure.
Figure 4:
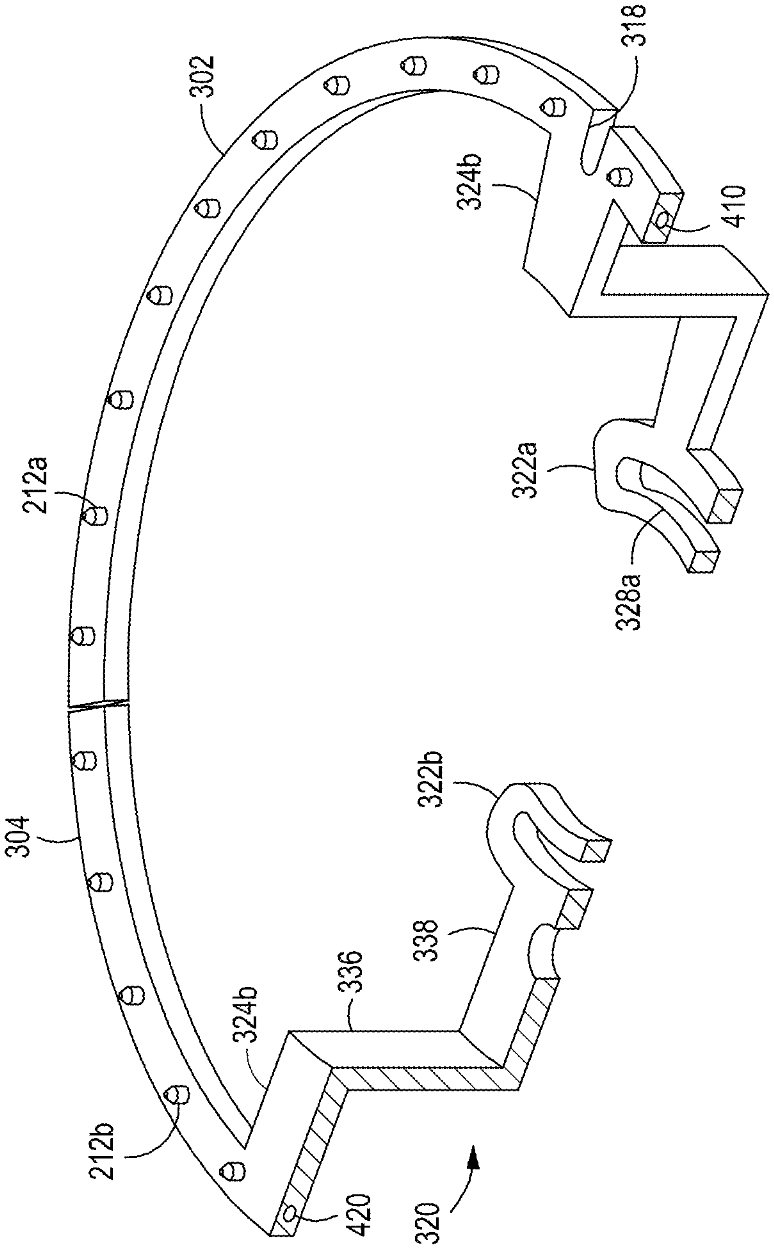
FIG. 4 depicts a cross-sectional isometric view of a cooling assembly in accordance with at least some embodiments of the present disclosure.

FIG. 3 depicts an isometric view of a cooling assembly 134 in accordance with at least some embodiments of the present disclosure. FIG. 4 depicts a cross-sectional isometric view of the cooling assembly 134 in accordance with at least some embodiments of the present disclosure. In some embodiments, the cooling assembly 134 may be a single annular component. In some embodiments, the cooling assembly 134 may be two or more arcuate components that together form an annular component or substantially annular component (i.e., with a small gap therebetween). The two or more arcuate component design may advantageously facilitate easier installation of the cooling assembly 134 in the process chamber 100, for example, allowing for installation of the cooling assembly 134 with minimal or no disassembly of the substrate support 124.

As shown in FIG. 3, the cooling assembly 134 comprises a first hub component 302 and a second hub component 304. The first hub component 302 comprises a first cooling member 312 having an arcuate shape. The plurality of posts 212 include a plurality of first posts **212*a* that extend from an upper surface 206*a* of the first cooling member 312. In some embodiments, the cooling channel 145 includes a first cooling channel 410 (see FIG. 4) disposed in the first cooling member 312 that is fluidly coupled to the inlet 224. In some embodiments, the first cooling channel 410 extends to a plurality of first outlets 218*a* disposed in the plurality of first posts 212*a***.

The second hub component 304 comprises a second cooling member 314 that is arcuate in shape. The plurality of posts 212 include a plurality of second posts **212*b* that extend from an upper surface 206*b* of the second cooling member 314. In some embodiments, the cooling channel 145 includes a second cooling channel 420 (see FIG. 4) disposed in the second cooling member 314 that is fluidly coupled to a second inlet 710 (see FIG. 7) that extends to an outer surface of the second cooling member 314. In some embodiments, the second inlet 710 is disposed beneath the second cooling channel 420. In some embodiments, the first cooling channel 410 and the second cooling channel 420 are separate and fluidly independent from each other within the cooling assembly 134. When the second hub component 304 is placed adjacent to the first hub component 302, the first cooling member 312 is vertically aligned with the second cooling member 314 and together form the cooling member 202. In some embodiments, the second cooling channel 420 extends to a plurality of second outlets 218***b* disposed in the plurality of second posts 212*b*.

In some embodiments, the bracket 204 includes an arm 320 extending beneath the cooling member 202 and an arcuate lower plate 322 coupled to the arm 320. The arcuate lower plate 322 may be disposed radially inward of the cooling member 202. In some embodiments, the arcuate lower plate 322 is coupled to the base assembly 136 via one or more fastener openings 328 disposed in the arcuate lower plate 322. In some embodiments, the one or more fastener openings 328 comprise arcuate slots. The arcuate lower plate 322 is sized to be disposed about a lower portion of the base assembly 136.

In some embodiments, as depicted in FIG. 3, the bracket 204 comprises a first bracket 204*a* extending from the first cooling member 312. In some embodiments, the bracket 204 comprises a second bracket 204*b* extending from the second cooling member 314. In some embodiments, the first bracket 204*a* comprises one or more first arms 320*a* coupled to a first arcuate lower plate 322*a*. The one or more first arms 320*a* may extend from different locations of the first cooling member 312 to provide structure stability. In some embodiments, the one or more first arms 320*a* consist of two first arms.

In some embodiments, the bracket 204 comprises a second bracket 204*b* extending from the second cooling member 314. In some embodiments, the second bracket 204*b* comprises one or more second arms 320*b* coupled to a second arcuate lower plate 322*b*. The one or more second arms 320*b* may extend from different locations of the second cooling member 314 to provide structure stability. In some embodiments, the one or more second arms 320*b* consist of two second arms.

In some embodiments, each of the one or more first arms 320*a* comprises a first member 326 extending downward from a lower surface 308 of the cooling member 202 and a horizontal member 346 extending from the first member 326 to the first arcuate lower plate 322*a* of the arcuate lower plate 322. In some embodiments, each of the one or more second arms 320*b* comprises a second member 336 extending downward from the lower surface 308 of the cooling member 202 and a horizontal member 338 extending from the second member 336 to the second arcuate lower plate 322*b* of the arcuate lower plate 322. In some embodiments, the one or more fastener openings 328 include a first fastener opening 328*a* disposed in the first arcuate lower plate 322*a* and a second fastener opening 328*b* disposed in the second arcuate lower plate 322*b*.

In some embodiments, the cooling member 202 includes an anti-rotation slot 318 extending from an outer sidewall 315 thereof for coupling the pin 228 thereto. In some embodiments, the cooling member 202 includes a radially inward extending ledge 342. In some embodiments, the radially inward extending ledge 324 comprises a first ledge 324*a* coupled to each of the one or more first arms 320*a* and a second ledge 324*b* coupled to each of the one or more second arms 320*b*.

Figure 5:
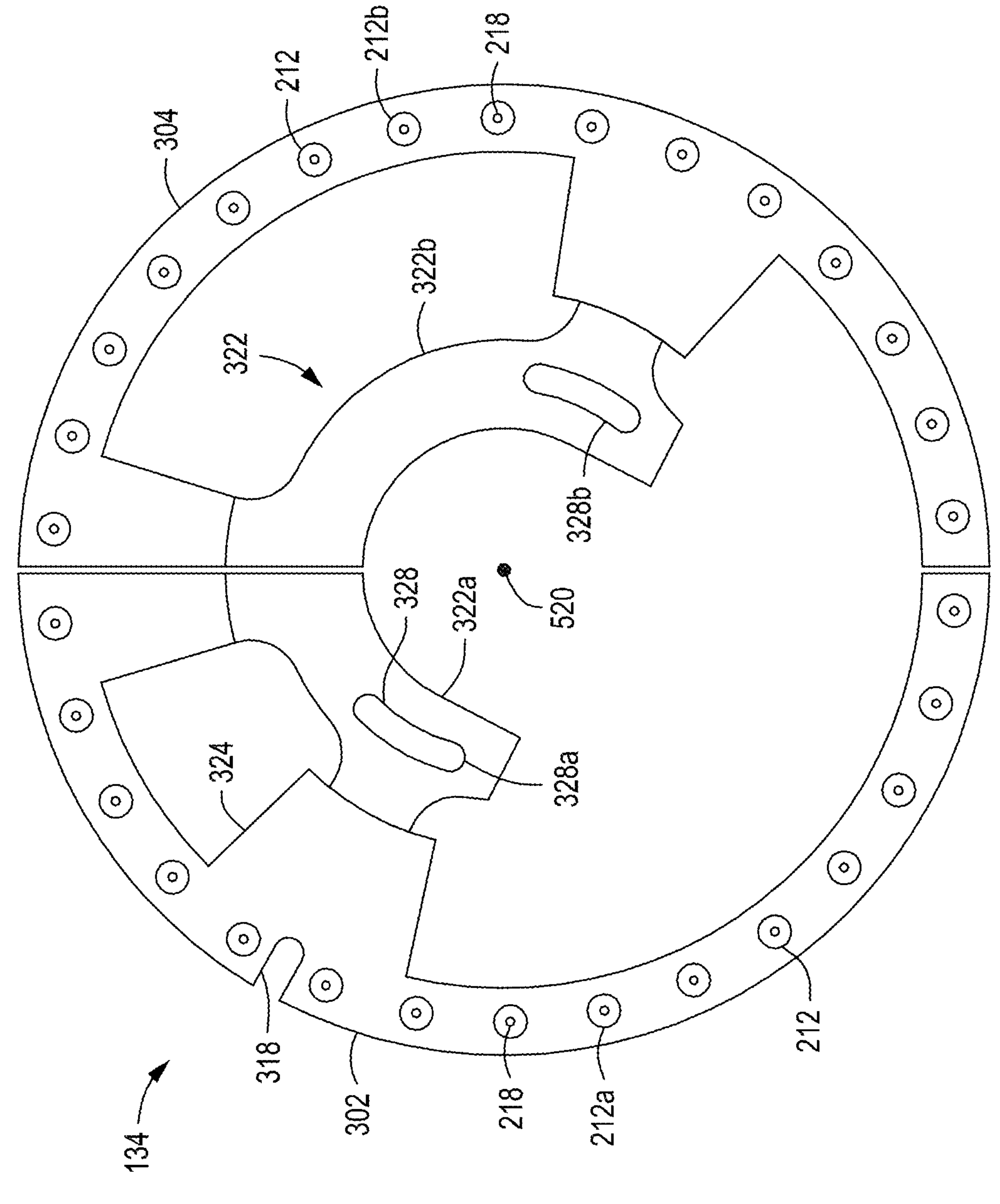
FIG. 5 depicts a top view of a cooling assembly in accordance with at least some embodiments of the present disclosure.

FIG. 5 depicts a top view of a cooling assembly 134 in accordance with at least some embodiments of the present disclosure. In some embodiments, the radially inward extending ledge 342 decreases in width as the ledge extends radially inward. In some embodiments, the anti-rotation slot 318 is aligned with the first ledge 324*a*. In some embodiments, the second arcuate lower plate 322*b* is larger in size than the first arcuate lower plate 322*a* so that the first fastener opening 328*a* is diametrically disposed with the second fastener opening 328*b*. In some embodiments, the first cooling member 312 and the second cooling member 314 each extend about 180 degrees about a central axis 520 of the cooling assembly 134.

Figure 6:
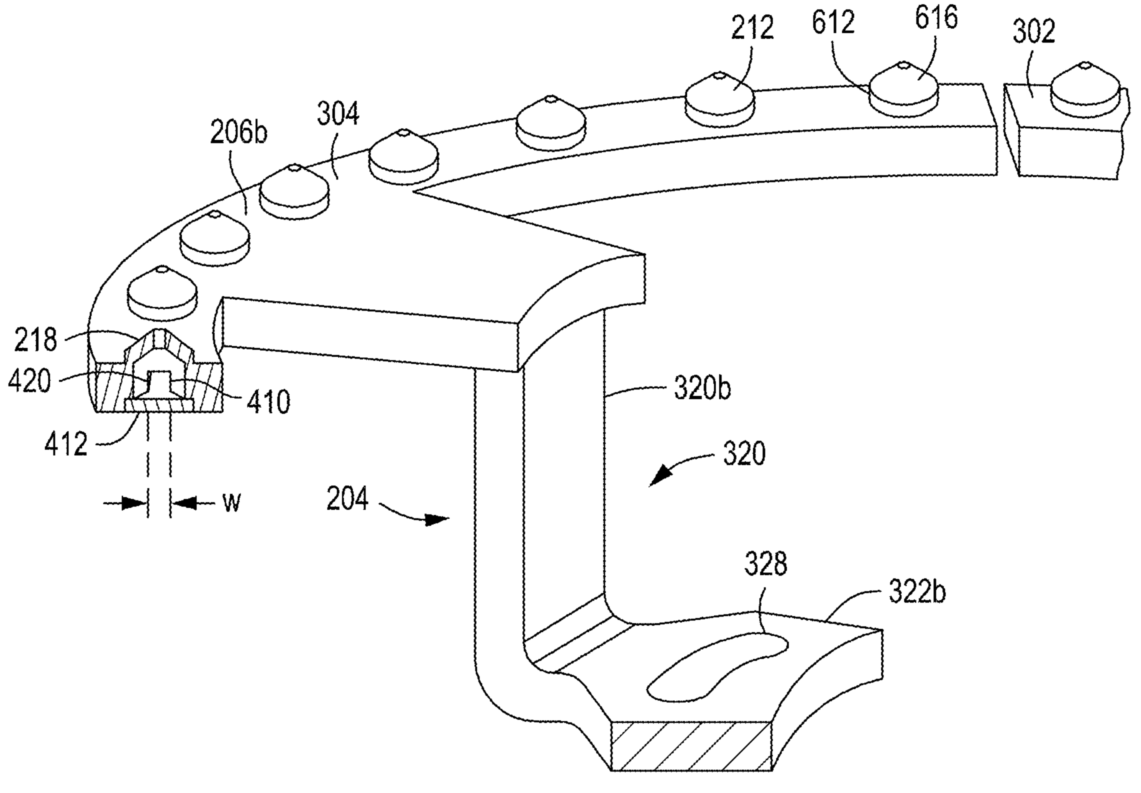
FIG. 6 depicts an isometric view of a portion of a cooling assembly in accordance with at least some embodiments of the present disclosure.

FIG. 6 depicts an isometric view of a portion of a cooling assembly 134 in accordance with at least some embodiments of the present disclosure. In some embodiments, the plurality of posts 212 have a conical shape. In some embodiments, the plurality of posts 212 have a lower portion 612 and an upper portion 616. In some embodiments, the lower portion 612 has a cylindrical shape. In some embodiments, the upper portion 616 has a conical shape so that an internal volume from the cooling channel 145 to each outlet of the one or more outlets 218 decreases to encourage increased flow velocity through the one or more outlets 218. In some embodiments, a diameter of each of the one or more outlets 218 is less than a width W of the cooling channel 145 to promote more uniform fluid flow through the cooling channel 145. In some embodiments, the width W is about 0.05 to about 0.2 inches. In some embodiments, the diameter of the one or more outlets 218 is about 0.01 to about 0.1 inches. In some embodiments, the cooling channel 145 is covered with a cap 412 to at least partially define the cooling channel 145. In some embodiments, the width W is the width of the cooling channel 145 at locations between the plurality of posts 212. In some embodiments, an inner diameter (i.e., diameter of inner sidewalls of lower portion) of the lower portion 612 is greater than the width W of the cooling channel 145. The inventors have observed that such an arrangement advantageously promotes more uniform fluid flow through the cooling channel 145.

Figure 8A:
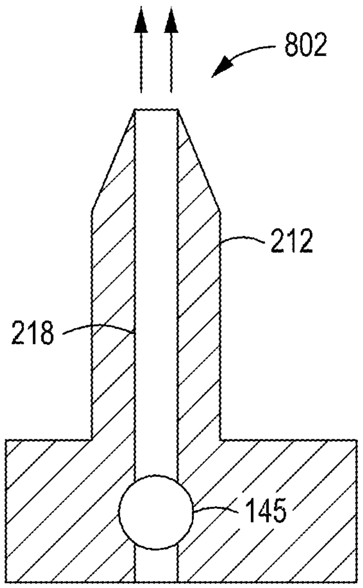
FIGS. 8A, 8B, 8C, and 8D depict cross-sectional side views of a post of the plurality of posts in accordance with at least some embodiments of the present disclosure.
Figure 8B:
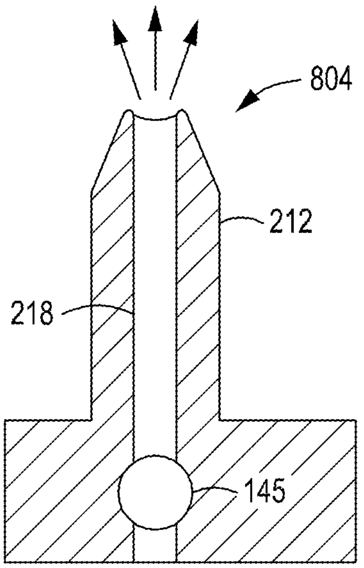

FIGS. 8A through 8D depict cross-sectional side views of a post of the plurality of posts 212 in accordance with at least some embodiments of the present disclosure. In some embodiments, as depicted in FIG. 8A, the plurality of posts 212 have a sharp edge 802 at an exit of the one or more outlets 218 to advantageously promote more targeted or focused flow towards the electrostatic chuck 152. In some embodiments, as depicted in FIG. 8B, the plurality of posts 212 have a rounded edge 804 at the exit of the one or more outlets 218 to provide more broader flow towards the electrostatic chuck 152.

Figure 8C:
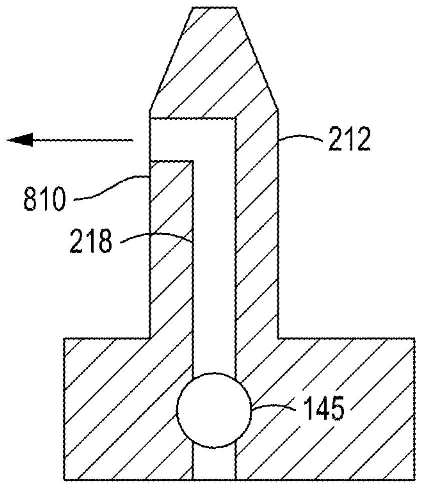
Figure 8D:
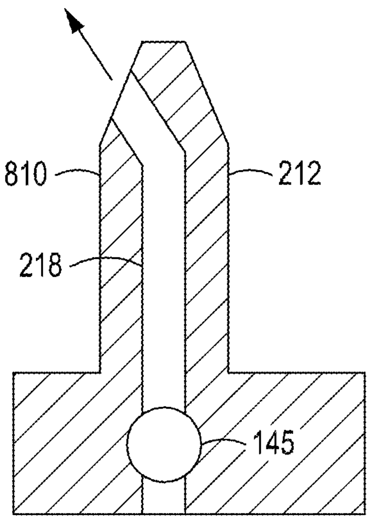

In some embodiments, as depicted in FIG. 8C, the plurality of posts 212 the one or more outlets 218 extend vertically upward from the cooling channel 145 and then perpendicularly outward to a sidewall 810 of the plurality of posts 212. In some embodiments, the sidewall 810 is a sidewall that faces the electrostatic chuck 152. In some embodiments, as depicted in FIG. 8D, the plurality of posts 212 the one or more outlets 218 extend vertically upward from the cooling channel 145 and then outward and upward to a sidewall 810 of the plurality of posts 212. In some embodiments, the sidewall 810 is a sidewall that faces the electrostatic chuck 152. The posts of FIGS. 8C and 8D can have a sharp edge or rounded edge at an exit of the one or more outlets 218.

Figure 7:
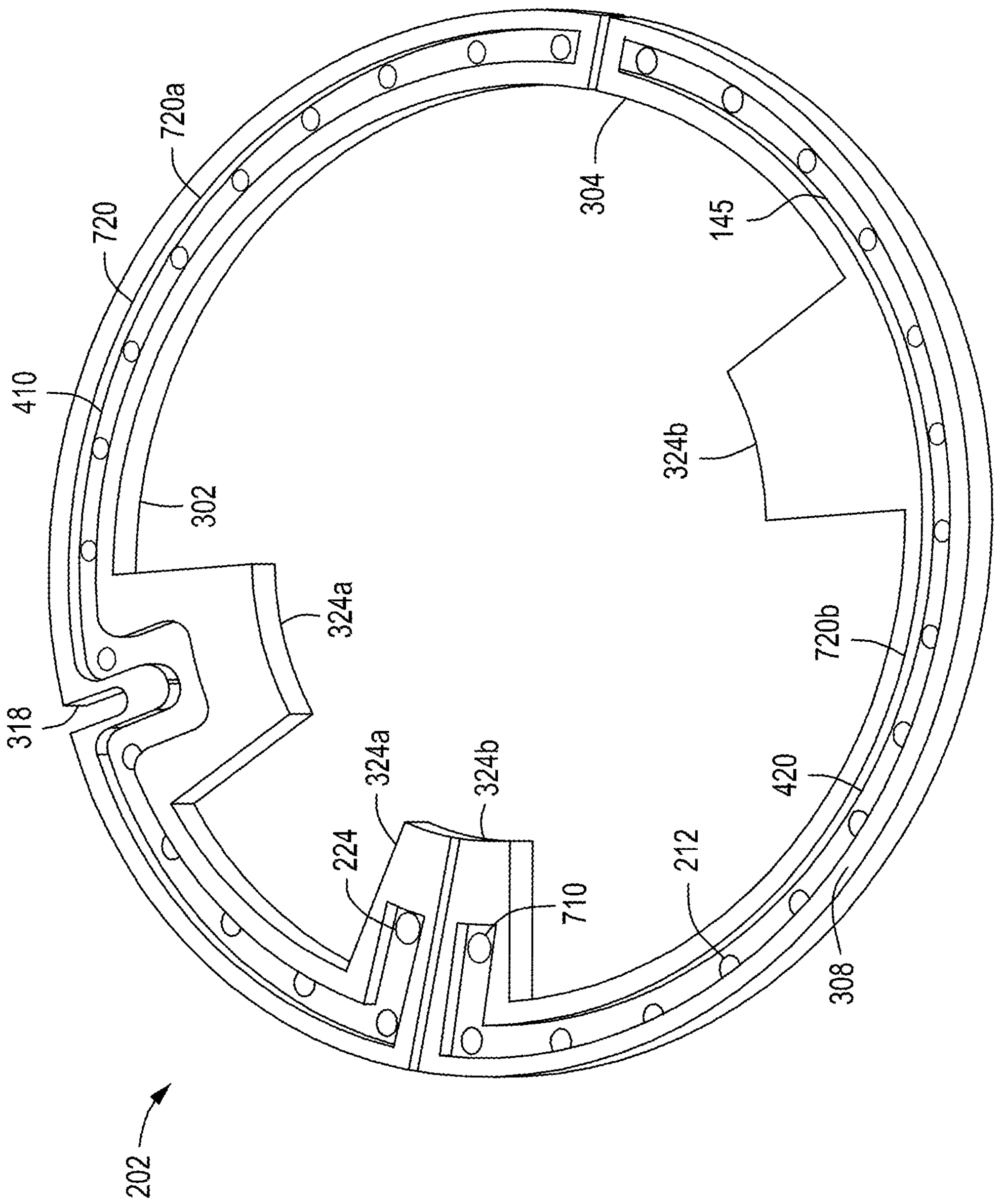
FIG. 7 depicts a bottom view of a cooling member in accordance with at least some embodiments of the present disclosure.

FIG. 7 depicts a bottom view of a cooling member 202 in accordance with at least some embodiments of the present disclosure. In some embodiments, the lower surface 308 of the cooling member 202 includes a recess 720 that at least partially defines the cooling channel 145. In some embodiments, the cap 412 is disposed in or over the recess 720 to define the cooling channel 145. In some embodiments, the recess 720 comprises a first recess 720*a* formed in the first cooling member 312 and a second recess 720*b* formed in the second cooling member 314 and the cap 412 comprises a first cap to cover the first recess 720*a* and a second cap to cover the second recess 720*b* (first cap and second cap not shown to show the cooling channel 145).

In some embodiments, a second inlet 710 extends to the second cooling channel 420. In some embodiments, the second inlet 710 extends through the second cap. In some embodiments, the cooling channel 145 extends around the anti-rotation slot 318. In some embodiments, the inlet 224 is disposed in the first ledge 324*a*. In some embodiments, the second inlet 710 is disposed in the second ledge 324*b*.

While the foregoing is directed to embodiments of the present disclosure, other and further embodiments of the disclosure may be devised without departing from the basic scope thereof. In some embodiments, the term "about" used in the present disclosure may be within 25 percent of the listed values. In some embodiments, the term "about" used in the present disclosure may be within 10 percent of the listed values.

The invention claimed is:

1. A substrate support, comprising:

a pedestal having a substrate supporting surface and a backside opposite the substrate supporting surface; and a cooling assembly coupled to the pedestal and configured to provide cooling gas toward the backside of the pedestal, wherein the cooling assembly includes:

a first hub component, comprising a first cooling member that is arcuate in shape and having a first cooling channel disposed therein that is fluidly coupled to a first inlet that extends to an outer surface of the first cooling member, and one or more first outlets extending from the first cooling channel to an upper surface of the first cooling member configured to direct the cooling gas to a region above the first cooling member and proximate a radially outermost sidewall of the pedestal;

a second hub component, comprising a second cooling member that is arcuate in shape and having a second cooling channel disposed therein that is fluidly coupled to a second inlet that extends to an outer surface of the second cooling member; and one or more second outlets extending from the second cooling channel to an upper surface of the second cooling member configured to direct the cooling gas to a region above the cooling member and proximate the radially outermost sidewall of the pedestal, wherein the first cooling member and the second cooling member each extend about 180 degrees about a central axis of the cooling assembly; and a plurality of posts extending from the first cooling member and the second cooling member and disposed in a circular array, wherein the one or more first outlets and the one or more second outlets extend through respective ones of the plurality of posts;

wherein when the second hub component is placed adjacent the first hub component, the first cooling member is vertically aligned with the second cooling member so that the cooling assembly is annular, wherein the one or more first outlets and the one or more second outlets are disposed along the circular array that is disposed radially outward of the radially outermost sidewall of the pedestal;

a first bracket coupled to the first cooling member, wherein the first bracket includes a first arcuate lower plate coupled to the first cooling member via a first arm, and wherein the first arcuate lower plate includes a first fastener opening; and a second bracket coupled to the second cooling member, wherein the second bracket includes a second arcuate lower plate coupled to the second cooling member via a second arm, and wherein the second arcuate lower plate includes a second fastener opening.

2. The substrate support of claim 1, wherein the first cooling member includes an anti-rotation slot extending from an outer sidewall thereof, and wherein the cooling channel extends around the anti-rotation slot.

3. The substrate support of claim 1, wherein a lower surface of the first cooling member includes a recess, and further comprising a cap disposed in or over the recess to define the first cooling channel.

4. The substrate support of claim 1, wherein the one or more first outlets are disposed radially outward of the radially outermost sidewall of the pedestal.

5. The substrate support of claim 1, wherein the plurality of posts have a conical shape.

6. The substrate support of claim 1, wherein the second arcuate lower plate is larger in size than the first arcuate lower plate.

7. A process chamber, comprising:

a chamber body defining an interior volume therein; and the substrate support of claim 1 disposed in the interior volume.

8. The process chamber of claim 7, further comprising a cooling fluid source coupled to the first cooling channel.

9. The process chamber of claim 8, wherein the cooling fluid source is a backside gas source provided via the substrate support.

10. The process chamber of claim 8, wherein the cooling fluid source is a process gas source provided via sidewalls of the chamber body.

11. The process chamber of claim 7, further comprising:

a deposition ring disposed on a peripheral edge of the pedestal and having a groove on a lower surface thereof; and a pin coupled to the first cooling member, wherein the pin extends into the groove of the deposition ring to prevent rotation of the deposition ring with respect to the cooling assembly.

12. The process chamber of claim 7, wherein the pedestal comprises an electrostatic chuck (ESC).

* * * * *